United States Patent
Inoue

(10) Patent No.: US 7,750,439 B2
(45) Date of Patent: Jul. 6, 2010

(54) ESD PROTECTION DEVICE

(75) Inventor: Tomoki Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 11/563,848

(22) Filed: Nov. 28, 2006

(65) Prior Publication Data

US 2007/0120193 A1    May 31, 2007

(30) Foreign Application Priority Data

Nov. 28, 2005    (JP) .............................. 2005-341504

(51) Int. Cl.
*H01L 23/62*    (2006.01)
(52) U.S. Cl. ........................ 257/603; 257/355; 257/360; 257/363
(58) Field of Classification Search ................. 257/358, 257/359, 360, 361, 362, 363, 603, 605, 606
See application file for complete search history.

(56) References Cited

U.S. PATENT DOCUMENTS

| | | | | |
|---|---|---|---|---|
| 4,695,916 A * | 9/1987 | Satoh et al. | ................... | 361/56 |
| 5,490,215 A * | 2/1996 | Pelegris | ...................... | 379/412 |
| 5,668,384 A * | 9/1997 | Murakami | ................... | 257/106 |
| 6,147,853 A | 11/2000 | Berthiot | | |
| 6,262,442 B1 * | 7/2001 | Kravtchenko et al. | ....... | 257/106 |
| 6,304,126 B1 | 10/2001 | Berthiot | | |
| 6,377,434 B1 * | 4/2002 | Martineau et al. | ........... | 361/119 |
| 7,285,828 B2 * | 10/2007 | Salcedo et al. | .............. | 257/357 |
| 2004/0012052 A1 * | 1/2004 | Kawamoto | ................... | 257/362 |

FOREIGN PATENT DOCUMENTS

| | | |
|---|---|---|
| JP | 11-168175 | 6/1999 |
| JP | 2002-94012 | 3/2002 |

OTHER PUBLICATIONS

NN84056304, "Lightning Surge Suppressor" IBM Technical Disclosure Bulletin, May 1984, US vol. 26, issue 12, p. 6304-6305.*
U.S Appl. No. 11/537,842, filed Oct. 2, 2006, Tomoki Inoue.
NN84056304, "Lightning Surge Suppressor", IBM Technical Disclosure Bulletin, May 1984, US, vol. 26, Issue 12, pg. 6304-6305.

* cited by examiner

*Primary Examiner*—Kiesha R Bryant
*Assistant Examiner*—Eric Ward
(74) *Attorney, Agent, or Firm*—Oblon, Spivak, McClelland, Maier & Neustadt, L.L.P.

(57) ABSTRACT

An ESD protection device includes: a semiconductor substrate of a first conductivity type having a first major surface and a second major surface; a signal input electrode formed on the first major surface of the semiconductor substrate; a base region of a second conductivity type formed on a surface region of the second major surface of the semiconductor substrate; a diffusion region of the first conductivity type; a resistor layer formed on the second major surface of the semiconductor substrate of the first conductivity type; a signal output electrode electrically connected to the diffusion region of the first conductivity type; and a ground electrode electrically connected to the resistor layer. The diffusion region is selectively formed on a surface region of the base region of the second conductivity type in the semiconductor substrate of the first conductivity type. The resistor layer is electrically connected to the diffusion region of the first conductivity type.

2 Claims, 16 Drawing Sheets

ESD PROTECTION DEVICE

CROSS-REFERENCE TO RELATED APPLICATIONS

This application is based upon and claims the benefit of priority from the prior Japanese Patent Application No. 2005-341504, filed on Nov. 28, 2005; the entire contents of which are incorporated herein by reference.

BACKGROUND OF THE INVENTION

1. Field of the Invention

This invention relates to an ESD (Electrostatic Discharge) protection device.

2. Background Art

Conventionally, an ESD protection diode having a built-in EMI filter for filtering high-frequency signals is formed by inserting ESD protection diodes in parallel between the signal line and the ground electrode and inserting a resistor between the cathodes of the diodes. However, one-chip configuration of a conventional high-pass filter for filtering low-frequency signals has not been achieved. Conventionally, such a high-pass filter is configured by mounting electronic parts of diodes and resistors on a mounting board such as a printed circuit board.

As a conventional technique, JP 11-168175A discloses a surge protection structure connected between two input terminals and two output terminals, the output terminals being connected to the inputs of a circuit to be protected. The first input terminal is connected to the first output terminal via an impedance (which forms a junction capacitance with polysilicon). The second input terminal is connected to the second output terminal. The input terminals are interconnected by a first Zener diode. The output terminals are interconnected by a second Zener diode having the same polarity as the first Zener diode. On the other hand, JP 2002-094012A discloses a protective element where a P$^+$-type polycrystalline Si member is wired on an arbitrary signal transfer path from an input terminal via an input buffer to an internal logic circuit. A P$^+$-type region, an N$^-$-type region, a p$^-$-type region, and an N$^+$-type region are laterally arranged. The N$^+$-type region is connected to an N$^+$-type polycrystalline Si member that is electrically connected to the reference potential (GND). Thus the element forms a thyristor to be triggered by punch-through.

SUMMARY OF THE INVENTION

According to an aspect of the invention, there is provided an ESD protection device including: a semiconductor substrate of a first conductivity type having a first major surface and a second major surface; a signal input electrode formed on the first major surface of the semiconductor substrate; a base region of a second conductivity type formed on a surface region of the second major surface of the semiconductor substrate; a diffusion region of the first conductivity type selectively formed on a surface region of the base region of the second conductivity type in the semiconductor substrate of the first conductivity type; a resistor layer formed on the second major surface of the semiconductor substrate of the first conductivity type, the resistor layer being electrically connected to the diffusion region of the first conductivity type; a signal output electrode electrically connected to the diffusion region of the first conductivity type; and a ground electrode electrically connected to the resistor layer.

According to other aspect of the invention, there is provided an ESD protection device including: a semiconductor substrate having a first major surface and a second major surface; a ground electrode formed on the first major surface of the semiconductor substrate; a first diffusion region of a second conductivity type selectively formed on a surface region of the second major surface of the semiconductor substrate; a second diffusion region of the first conductivity type selectively formed on a surface region of the first diffusion region of the second conductivity type; a third diffusion region of the first conductivity type selectively formed on a surface region of the first diffusion region of the second conductivity type; a signal input electrode connected to the second diffusion region of the first conductivity type; a signal output electrode connected to the third diffusion region of the first conductivity type; a fourth diffusion region having the same conductivity type as the first major surface of the semiconductor substrate, the fourth diffusion region being connected to the signal output electrode and being selectively formed on a surface region of the second major surface of the semiconductor substrate.

According to other aspect of the invention, there is provided an ESD protection device including: a signal input electrode; a signal output electrode; a ground electrode; a bidirectional rectifier connected between the signal input electrode and the signal output electrode; a first resistor connected between the signal output electrode and the ground electrode; and a first rectifying element connected between the signal output electrode and the ground electrode.

DETAILED DESCRIPTION OF THE INVENTION

Figure 1:
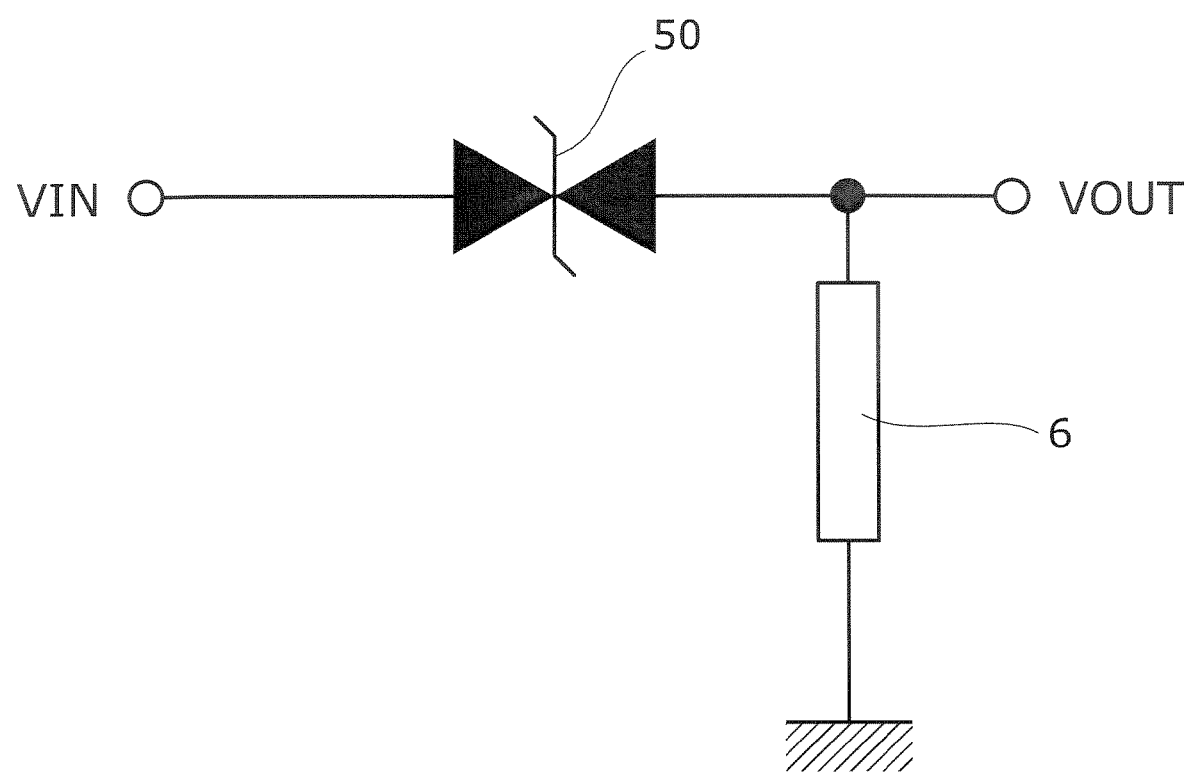
FIG. 1 is an equivalent circuit diagram of an ESD protection device according to a first embodiment of the invention.

Embodiments of the invention will now be described. In the drawings, the equivalent elements and/or components are labeled with common reference numerals.

First Embodiment

The first embodiment is described with reference to FIGS. 1 and 2.

Figure 2:
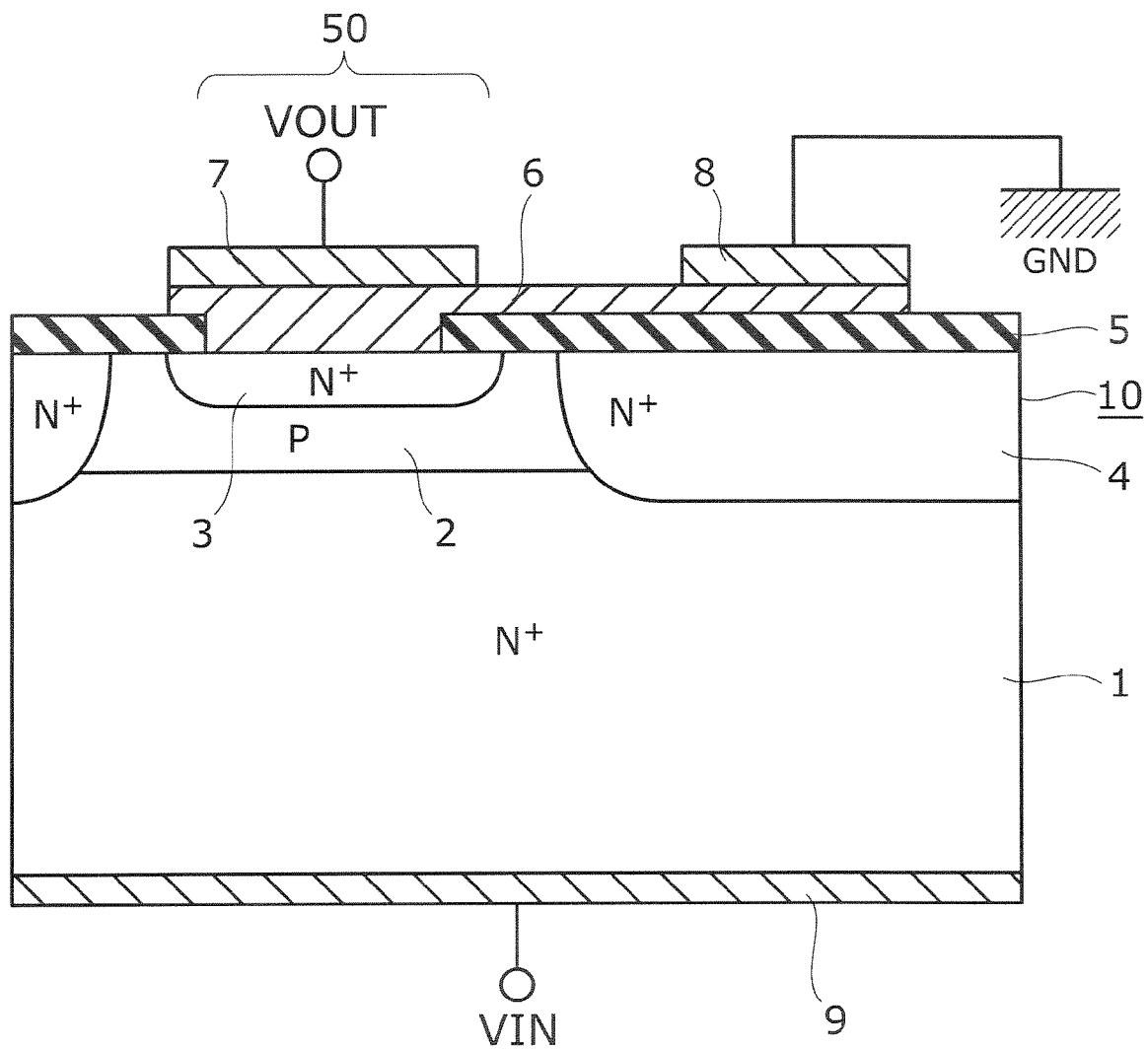
FIG. 2 is a cross section of the relevant part of an ESD protection device according to the first embodiment of the invention.

FIG. 1 is an equivalent circuit diagram of an ESD protection device according to this embodiment, and FIG. 2 is a cross section of the relevant part of an ESD protection device according to this embodiment. As shown in FIG. 1, a diode (bidirectional Zener diode) 50, which constitutes the ESD protection device, and a resistor 6 are connected between a signal input (VIN) and a signal output (VOUT). One end of the resistor 6 is connected to one end of the diode 50, and the other end of the resistor 6 is grounded (GND).

As shown in FIG. 2, a silicon semiconductor substrate 10 is composed of an N$^+$-type high-concentration layer 1 and a P-type silicon epitaxial layer 2 formed on the high-concentration layer 1. The high-concentration layer 1 has an impurity concentration of $1\times10^{19}/cm^3$ or more, and the P-type silicon epitaxial layer 2 has an impurity concentration of about $1\times10^{15}$ to $1\times10^{17}/cm^3$. A signal input electrode 9 is formed on the first major surface (on the high-concentration layer side) of the semiconductor substrate 10. An N$^+$-high-concentration impurity diffusion region for defining a device region is formed on the surface region of the second major surface (on the silicon epitaxial layer side) of the semiconductor substrate 10. The impurity diffusion region constitutes a device isolation region 4. The impurity concentration of the device isolation region 4 is comparable to that of the high-concentration layer 1. An N$^+$-high-concentration impurity diffusion region 3 is formed in the P-type silicon epitaxial layer 2 on the second major surface (on the silicon epitaxial layer side) of the semiconductor substrate 10. The second major surface (on the silicon epitaxial layer side) of the semiconductor substrate 10 is covered with an interlayer insulating film 5 such as a silicon oxide film, except in the center portion of the N$^+$-high-concentration impurity diffusion region 3.

A polysilicon film is formed as a resistor layer 6 on the interlayer insulating film 5. One end of the resistor layer 6 is connected to the exposed surface of the N$^+$-high-concentration impurity diffusion region 3, and the other end extends on the interlayer insulating film 5. The resistor layer 6 can be a metal silicide film made of tungsten silicide or the like, instead of the polysilicon film. A signal output electrode 7 is formed on the one end of the resistor layer 6 being in contact with the N$^+$-high-concentration impurity diffusion region 3. A ground electrode 8 to be electrically connected to the ground (GND) is formed on the other end of the resistor layer 6. Here, the ESD protection diode 50 is configured in the semiconductor substrate 10 so that the signal input electrode 9 serves as an anode electrode, the N$^+$-high-concentration layer 1 as an anode region, the P-type silicon epitaxial layer 2 as a base region, the N$^+$-high-concentration impurity diffusion region 3 as a cathode region, and the signal output electrode 7 as a cathode electrode. The resistor layer 6 serves as a resistor layer. These constitute a circuit shown in FIG. 1.

When an ESD pulse is applied to the VIN terminal (anode terminal) or the VOUT terminal (cathode terminal), breakdown occurs in the PN junction of the ESD protection diode 50, which releases electric charge through the resistor layer (polysilicon film) 6 to the ground. Furthermore, when a signal is inputted to the VIN terminal, a CR filter composed of the junction capacitance of the ESD protection diode 50 and the resistor layer 6 operates to attenuate low-frequency signals, thereby acting as a high-pass filter. Thus the configuration in FIG. 2 enables a high-pass filter to be formed on one chip.

Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements.

Second Embodiment

The second embodiment is described with reference to FIG. 3.

Figure 3:
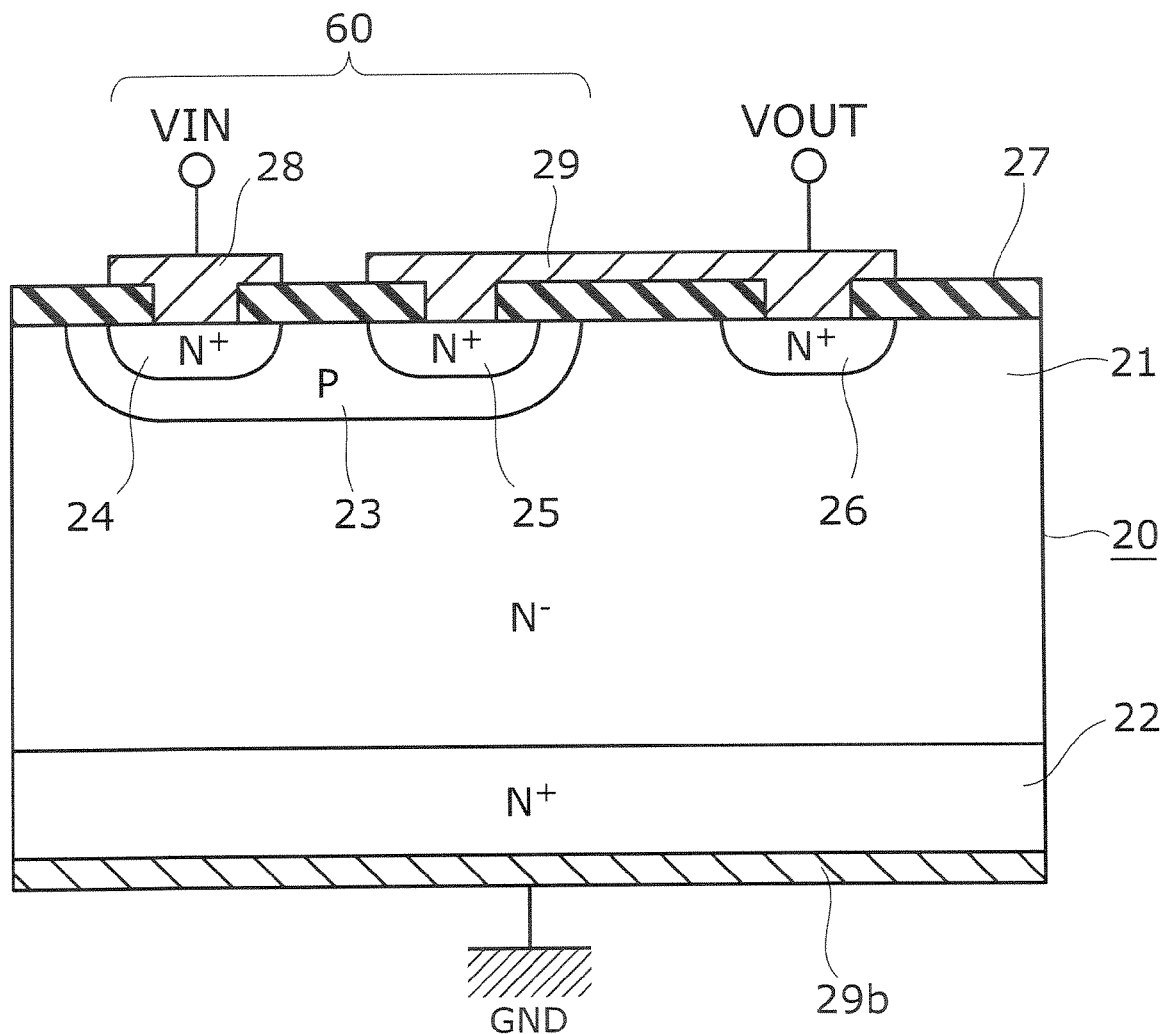
FIG. 3 is a cross section of the relevant part of an ESD protection device according to a second embodiment of the invention.

FIG. 3 is a cross section of an ESD protection device according to this embodiment. As shown in FIG. 3, a diode (bidirectional Zener diode) 60, which constitutes the ESD protection device, and a signal output electrode 29 are connected between a signal input (VIN) and a signal output (VOUT). One end of the signal output electrode 29 is connected to one end of the diode 60, and the other end is connected to an N$^+$-high-concentration impurity diffusion region 26.

A silicon semiconductor substrate 20 is composed of an N$^+$-type high-concentration layer 22 and an N$^-$-silicon epitaxial layer 21 formed on the high-concentration layer 22. The high-concentration layer 22 has an impurity concentration of $1\times10^{19}/cm^3$ or more, and the N$^-$-silicon epitaxial layer 21 has an impurity concentration of about $1\times10^{14}/cm^3$ or less. A signal input electrode 28 and a signal output electrode 29 are formed on the second major surface (on the silicon epitaxial layer side) of the semiconductor substrate 20. A P-type impurity diffusion region 23 is formed on the surface region of the second major surface (on the silicon epitaxial layer side) of the semiconductor substrate 20. N$^+$-high-concentration impurity diffusion regions 24, 25 are formed in the P-type impurity diffusion region 23 and exposed to the surface. Furthermore, an N$^+$-high-concentration impurity diffusion region 26 is formed on the surface region of the second major surface (on the silicon epitaxial layer side) and spaced apart from the P-type impurity diffusion region 23.

The impurity concentration of the N$^+$-high-concentration impurity diffusion regions 24, 25, 26 is comparable to that of the N$^+$-high-concentration layer 22. The second major surface (on the silicon epitaxial layer side) of the semiconductor substrate 20 is covered with an interlayer insulating film 27 such as a silicon oxide film, except in the center portion of the N$^+$-high-concentration impurity diffusion regions 24, 25, 26. A signal output electrode 29 is formed on the interlayer insulating film 27. One end of the signal output electrode 29 is connected to the exposed surface of the N$^+$-high-concentration impurity diffusion region 25, and the other end is connected to the exposed surface of the N$^+$-high-concentration impurity diffusion region 26. Furthermore, the signal output terminal (VOUT) is connected to the output signal electrode 29. A ground electrode 29b to be electrically connected to the ground (GND) is formed on the first major surface (on the high-concentration layer side) of the semiconductor substrate 20.

Here, the ESD protection diode 60 is configured in the semiconductor substrate 20 so that the signal input electrode 28 serves as an anode electrode, the N$^+$-high-concentration impurity diffusion region 24 as an anode region, the P-type impurity diffusion region 23 as a base region, the N+-high-concentration impurity diffusion region 25 as a cathode region, and the output signal electrode 29 as a cathode electrode. The signal output electrode 29 is grounded by the ground electrode 29b via a resistor (corresponding to the resistor 6 in FIG. 1) composed of the N+-high-concentration impurity diffusion region 26, the N−-silicon epitaxial layer 21, and the N+-type high-concentration layer 22.

When an ESD pulse is applied to the VIN terminal (anode terminal) or the VOUT terminal (cathode terminal), breakdown occurs in the PN junction of the ESD protection diode 60, which releases electric charge through the signal output electrode 29, the N+-high-concentration impurity diffusion region 26, N−-silicon epitaxial layer 21 and the N+-type high-concentration layer 22 to the ground. Furthermore, when a signal is inputted to the VIN terminal, a CR filter composed of the junction capacitance of the ESD protection diode 60 and the N−-silicon epitaxial layer 21 operates to attenuate low-frequency signals, thereby acting as a high-pass filter. This configuration enables a high-pass filter to be formed on one chip. Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements.

In this embodiment, the semiconductor substrate 20 is grounded. When a semiconductor chip is assembled in a package, the semiconductor chip is bonded onto a metal frame with eutectic or conductive paste. Therefore the parasitic inductance of the ground electrode is smaller than in the first embodiment. In the first embodiment, the parasitic inductance is larger because wiring is used to ground the ground electrode. Thus the configuration of the present embodiment can improve filter characteristics. Furthermore, the ESD protection diode 60 is isolated by the depletion layer formed in the PN junction between the P-type impurity diffusion region 23 and the N−-silicon epitaxial layer 21. However, a large capacitance of the depletion layer causes a disadvantage of attenuating signals because they escape to the ground electrode 29b. In order to prevent this, the depletion layer capacitance needs to be reduced. To this end, the N−-silicon epitaxial layer 21 needs to have a high specific resistance. The N−-silicon epitaxial layer is required to have a specific resistance of 10 Ωcm or more, which is preferably 100 Ωcm or more. The value of resistance between the signal output electrode and the ground electrode can be controlled by adjusting the area of the N+-high-concentration impurity diffusion region 26.

Third Embodiment

The third embodiment is described with reference to FIG. 4.

Figure 4:
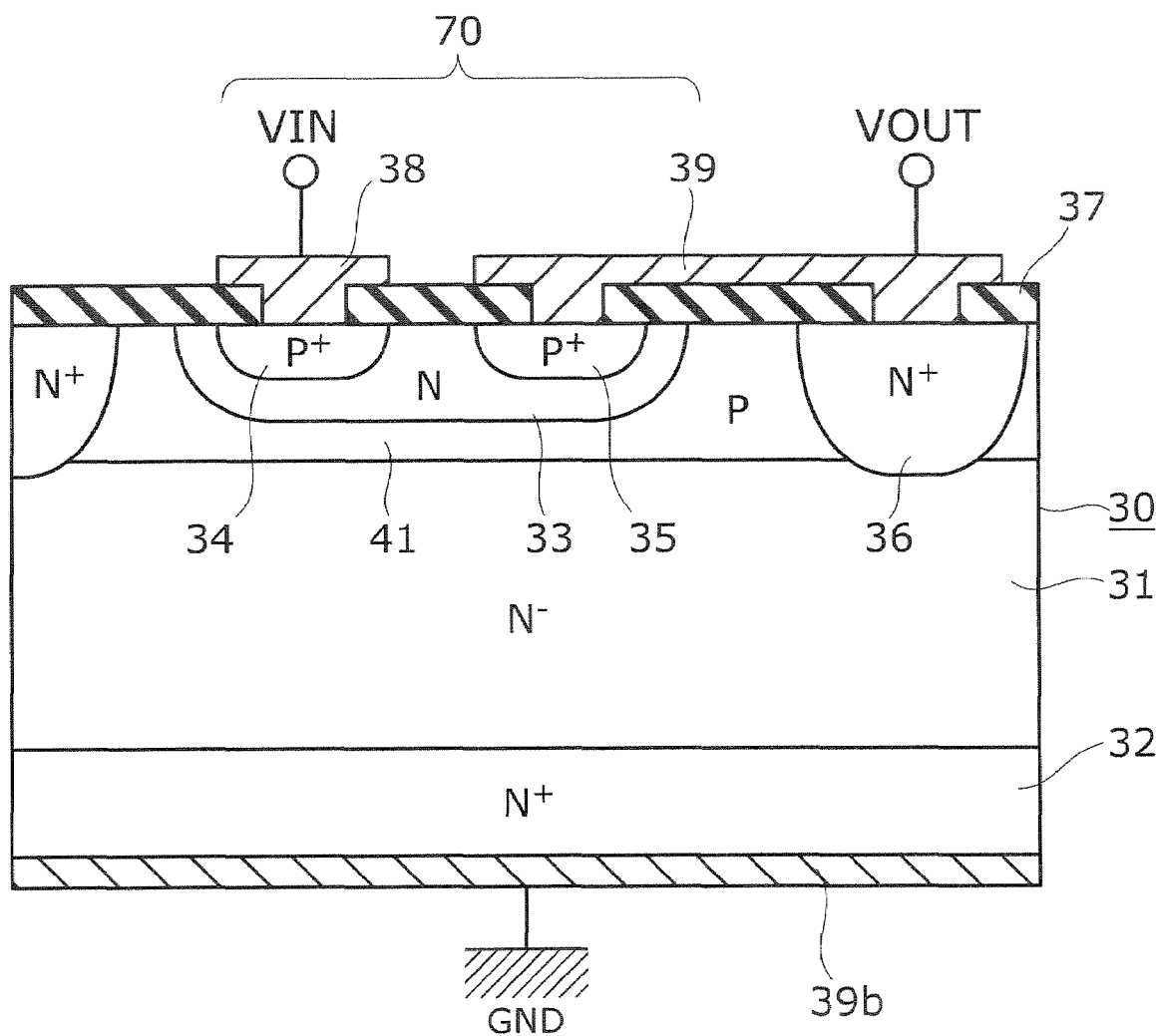
FIG. 4 is a cross section of the relevant part of an ESD protection device according to a third embodiment of the invention.

FIG. 4 is a cross section of an ESD protection device according to this embodiment. As shown in FIG. 4, a diode (bidirectional Zener diode) 70, which constitutes the ESD protection device, and a signal output electrode 39 are connected between a signal input (VIN) and a signal output (VOUT). One end of the signal output electrode 39 is connected to one end of the diode 70, and the other end of the is connected to a N+-high-concentration impurity diffusion region 36.

A silicon semiconductor substrate 30 is composed of an N+-type high-concentration layer 32, an N−-silicon epitaxial layer 31 formed on the high-concentration layer 32, and a P-type silicon epitaxial layer 41 formed on the N−-silicon epitaxial layer 31. The high-concentration layer 32 has an impurity concentration of $1 \times 10^{19}/cm^3$ or more, and the N−-silicon epitaxial layer 31 has an impurity concentration of about $1 \times 10^{14}/cm^3$ or less. A signal input electrode 38 and a signal output electrode 39 are formed on the second major surface (on the silicon epitaxial layer side) of the semiconductor substrate 30. In addition, P-type silicon epitaxial layer 31 can be formed by diffusion from the second major surface (on the silicon epitaxial layer side) of the semiconductor substrate.

On the surface region of the second major surface (on the silicon epitaxial layer side) of the semiconductor substrate 30 is formed an N-type impurity diffusion region 33 in the P−-silicon epitaxial layer 41. P+-high-concentration impurity diffusion regions 34, 35 are formed in the N-type impurity diffusion region 33 and exposed to the surface. Furthermore, an N+-high-concentration impurity diffusion region 36 is formed on the surface region of the second major surface (on the silicon epitaxial layer side). The impurity concentration of the N+-high-concentration impurity diffusion regions 36 is comparable to that of the N+-high-concentration layer 32. The second major surface (on the silicon epitaxial layer side) of the semiconductor substrate 30 is covered with an interlayer insulating film 37 such as a silicon oxide film, except in the center portion of the P+-high-concentration impurity diffusion regions 34, 35 and of the N+-high-concentration impurity diffusion region 36. A signal output electrode 39 is formed on the interlayer insulating film 37. One end of the signal output electrode 39 is connected to the exposed surface of the P+-high-concentration impurity diffusion region 35, and the other end is connected to the exposed surface of the N+-high-concentration impurity diffusion region 36. Furthermore, the signal output terminal (VOUT) is connected to the output signal electrode 39. A ground electrode 39b to be electrically connected to the ground (GND) is formed on the first major surface (on the high-concentration layer side) of the semiconductor substrate 30.

Here, the ESD protection diode 70 is configured in the semiconductor substrate 30 so that the input signal electrode 38 serves as an anode electrode, the P+-high-concentration impurity diffusion region 34 as an anode region, the N-type impurity diffusion region 33 as a base region, the P+-high-concentration impurity diffusion region 35 as a cathode region, and the output signal electrode 39 as a cathode electrode. The signal output electrode 39 is grounded by the ground electrode 39b via a resistor (corresponding to the resistor 6 in FIG. 1) composed of the N+-high-concentration impurity diffusion region 36, the N−-silicon epitaxial layer 31, and the N+-type high-concentration layer 32.

When an ESD pulse is applied to the VIN terminal (anode terminal) or the VOUT terminal (cathode terminal), breakdown occurs in the PN junction of the ESD protection diode 70, which releases electric charge through the signal output electrode 39, the N+-high-concentration impurity diffusion region 36, the N−-silicon epitaxial layer 31, and the N+-type high-concentration layer 32 to the ground. Furthermore, when a signal is inputted to the VIN terminal, a CR filter composed of the junction capacitance of the ESD protection diode 70 and the N−-silicon epitaxial layer 31 operates to attenuate low-frequency signals, thereby acting as a high-pass filter.

This configuration enables a high-pass filter to be formed on one chip. Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements.

In this embodiment, the semiconductor substrate 30 is grounded. When a semiconductor chip is assembled in a package, the semiconductor chip is bonded onto a metal frame with eutectic or conductive paste. Therefore the parasitic inductance of the ground electrode is smaller than in the first embodiment. In the first embodiment, the parasitic inductance is larger because wiring is used to ground the ground electrode. Thus the configuration of the present embodiment can improve filter characteristics.

The value of resistance (corresponding to the resistance 6 in FIG. 1) between the signal output electrode 39 and the ground electrode 39b can be controlled by adjusting the area of the N+-high-concentration impurity diffusion region 36.

In this embodiment, in contrast to the second embodiment, a P-type silicon epitaxial layer 41 is inserted between the N−-silicon epitaxial layer 31 and the ESD protection diode 70. This configuration reduces the capacitance between the N-type impurity diffusion region 33 and the ground electrode 39b, or the capacitance between the ESD protection diode 70 and the ground electrode 39b, because the junction capacitance between the N-type impurity diffusion region 33 and the P-type epitaxial layer 41 and the capacitance between the P-type epitaxial layer 41 and the N−-epitaxial layer 31 are inserted in series. Thus the signal attenuation can be prevented.

Fourth Embodiment

The fourth embodiment 4 is described with reference to FIG. 5.

Figure 5:
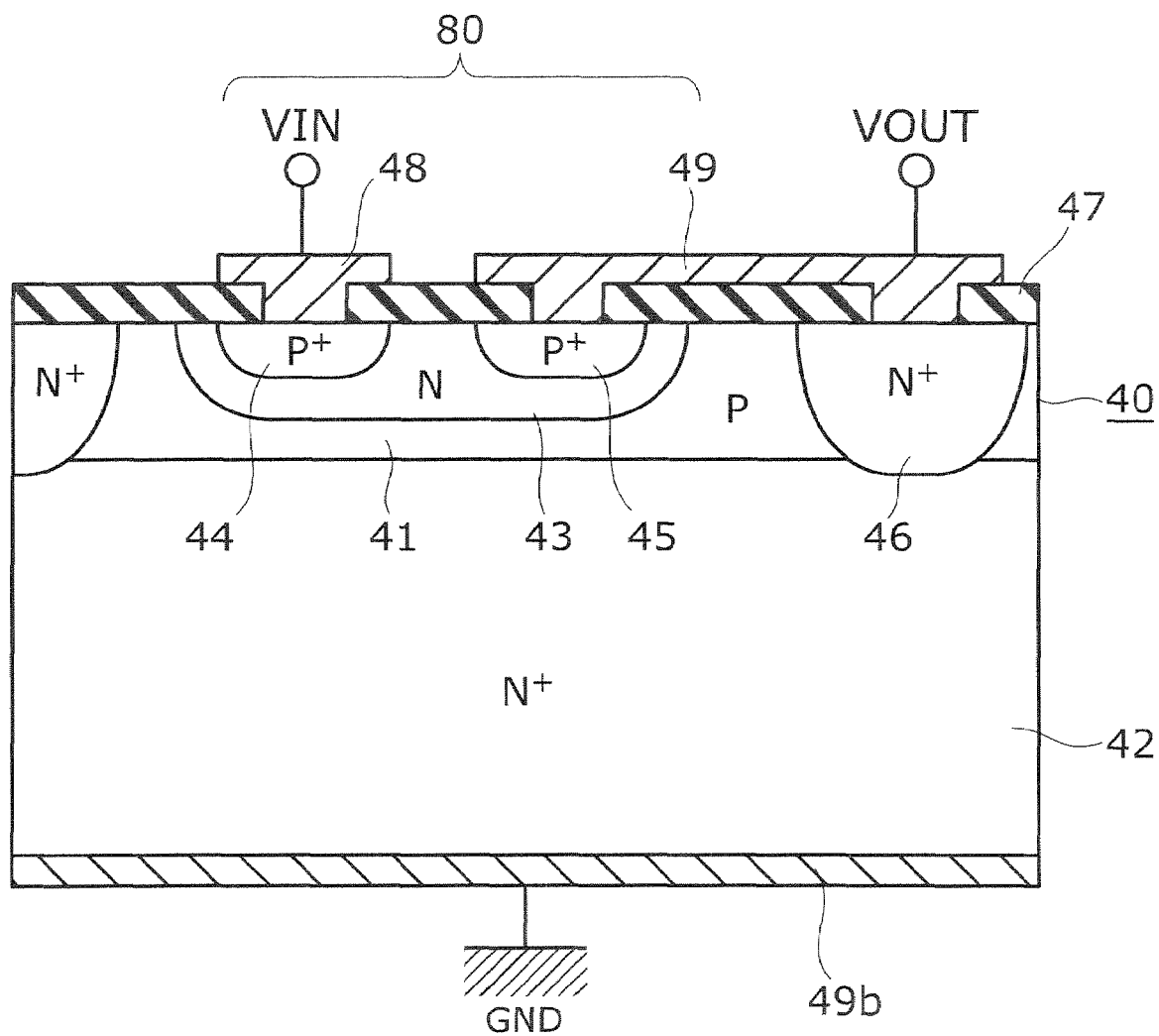
FIG. 5 is a cross section of the relevant part of an ESD protection device according to a fourth embodiment of the invention.

FIG. 5 is a cross section of an ESD protection device according to this embodiment. As shown in the figure, a diode (bidirectional Zener diode) 80, which constitutes the ESD protection device, and a signal output electrode 49 are connected between a signal input (VIN) and a signal output (VOUT). One end of the signal output electrode 49 is connected to one end of the diode 80, and the other end is connected to an N+-high-concentration impurity diffusion region 46.

A silicon semiconductor substrate 40 is composed of an N+-type high-concentration layer 42 and a P-type silicon epitaxial layer 41 formed on the high-concentration layer 42. The high-concentration layer 42 has an impurity concentration of $1 \times 10^{19}/cm^3$ or more, and the P-type silicon epitaxial layer 41 has an impurity concentration of about $1 \times 10^{18}$ to $1 \times 10^{19}/cm^3$ or less. A signal input electrode 48 and a signal output electrode 50 are formed on the second major surface (on the silicon epitaxial layer side) of the semiconductor substrate 40. On the surface region of the second major surface (on the silicon epitaxial layer side) of the semiconductor substrate 40 is formed an N-type impurity diffusion region 43 in the P-type silicon epitaxial layer 41. P+-high-concentration impurity diffusion regions 44, 45 are formed in the N-type impurity diffusion region 43 and exposed to the surface. Furthermore, an N+-high-concentration impurity diffusion region 46 is formed on the surface region of the second major surface (on the silicon epitaxial layer side). In addition, the P-type silicon epitaxial layer 41 can be formed by diffusion from the second major surface (on the silicon epitaxial layer side) of the semiconductor substrate 40.

The impurity concentration of the N+-high-concentration impurity diffusion regions 46 is comparable to that of the N+-high-concentration layer 42. The second major surface (on the silicon epitaxial layer side) of the semiconductor substrate 40 is covered with an interlayer insulating film 47 such as a silicon oxide film, except in the center portion of the P+-high-concentration impurity diffusion regions 44, 45 and of the N+-high-concentration impurity diffusion region 46. A signal output electrode 49 is formed on the interlayer insulating film 47. One end of the signal output electrode 49 is connected to the exposed surface of the P+-high-concentration impurity diffusion region 45, and the other end is connected to the exposed surface of the N+-high-concentration impurity diffusion region 46. Furthermore, the signal output terminal (VOUT) is connected to the output signal electrode 49. A ground electrode 49b to be electrically connected to the ground (GND) is formed on the first major surface (on the high-concentration layer side) of the semiconductor substrate 40.

Here, the ESD protection diode 80 is configured in the semiconductor substrate 40 so that the input signal electrode 48 serves as an anode electrode, the P+-high-concentration impurity diffusion region 44 as an anode region, the N-type impurity diffusion region 43 as a base region, the P+-high-concentration impurity diffusion region 45 as a cathode region, and the output signal electrode 49 as a cathode electrode. The signal output electrode 49 is grounded by the ground electrode 49b via a resistor composed of the N+-high-concentration impurity diffusion region 46 and the N+-type high-concentration layer 42.

When an ESD pulse is applied to the VIN terminal (anode terminal) or the VOUT terminal (cathode terminal), breakdown occurs in the PN junction of the ESD protection diode 80, which releases electric charge through the signal output electrode 49, the N+-high-concentration impurity diffusion region 46 and the N+-type high-concentration layer 42 to the ground. Furthermore, when a signal is inputted to the VIN terminal, a CR filter composed of the junction capacitance of the ESD protection diode 80, the N+-high-concentration impurity diffusion region 46 and the N+-type high-concentration layer 42 operates to attenuate low-frequency signals, thereby acting as a high-pass filter. This configuration enables a high-pass filter to be formed on one chip. Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements.

In this embodiment, the semiconductor substrate 40 is grounded. When a semiconductor chip is assembled in a package, the semiconductor chip is bonded onto a metal frame with eutectic or conductive paste. Therefore the parasitic inductance of the ground electrode is smaller than in the first embodiment. In the first embodiment, the parasitic inductance is larger because wiring is used to ground the ground electrode. Thus the configuration of the present embodiment can improve filter characteristics.

In this embodiment, in contrast to FIG. 4, the N−-epitaxial layer is omitted. This configuration can reduce the resistance (corresponding to the resistance 6 in FIG. 1) between the signal output electrode 49 and the ground electrode 49b.

In this embodiment, in contrast to the second embodiment, a P-type silicon epitaxial layer 41 is inserted between the N+-type high-concentration layer 42 and the ESD protection diode 80. This configuration reduces the capacitance between the N-type impurity diffusion region 43 and the ground electrode 49b, or the capacitance between the ESD protection diode 80 and the ground electrode 49b, because the junction capacitance between the N-type impurity diffusion region 43 and the P-type epitaxial layer 41 and the capacitance between the P-type epitaxial layer 41 and the N+-type high-concentration layer 42 are inserted in series. Thus the signal attenuation can be prevented.

Fifth Embodiment

The fifth embodiment 5 is described with reference to FIG. 6.

Figure 6:
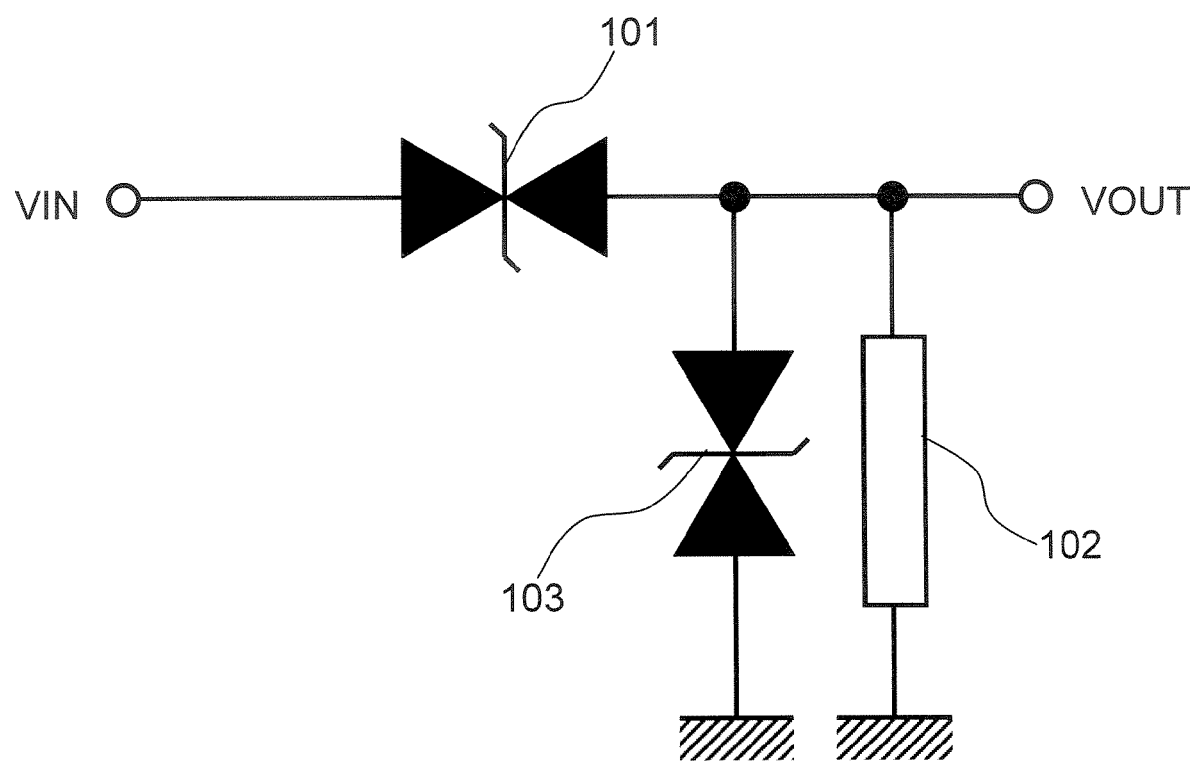
FIG. 6 is an equivalent circuit diagram of an ESD protection device according to a fifth embodiment.

FIG. 6 is an equivalent circuit diagram of an ESD protection device according to this embodiment. As shown in FIG. 6, a diode (bidirectional Zener diode) 101 is connected between a signal input (VIN) and a signal output (VOUT) as a bidirectional rectifier portion which constitutes the ESD protection device. On the other hand, a diode (bidirectional Zener diode) 103 as a rectifier element and a resistor 102 are connected in parallel between the signal output (VOUT) and the ground (GND).

In the ESD protection device shown in FIG. 6, in contrast to the ESD protection device shown in FIG. 1, the resistor 102 and the resistor 103 are connected in parallel, therefore on the application of an ESD pulse the diode 103 operates to release electric charge to the ground, then ESD tolerance increases more than the ESD protection device shown in FIG. 1. Furthermore, when a signal is inputted to the VIN terminal, a CR filter composed of the junction capacitance of the ESD protection diode 101 and the resistor 102 operates to attenuate low-frequency signals, thereby acting as a high-pass filter. In addition, the junction capacitance of the diode 103 is preferably smaller than the junction capacitance of the diode 101 in order to improve filter characteristics.

Figure 7:
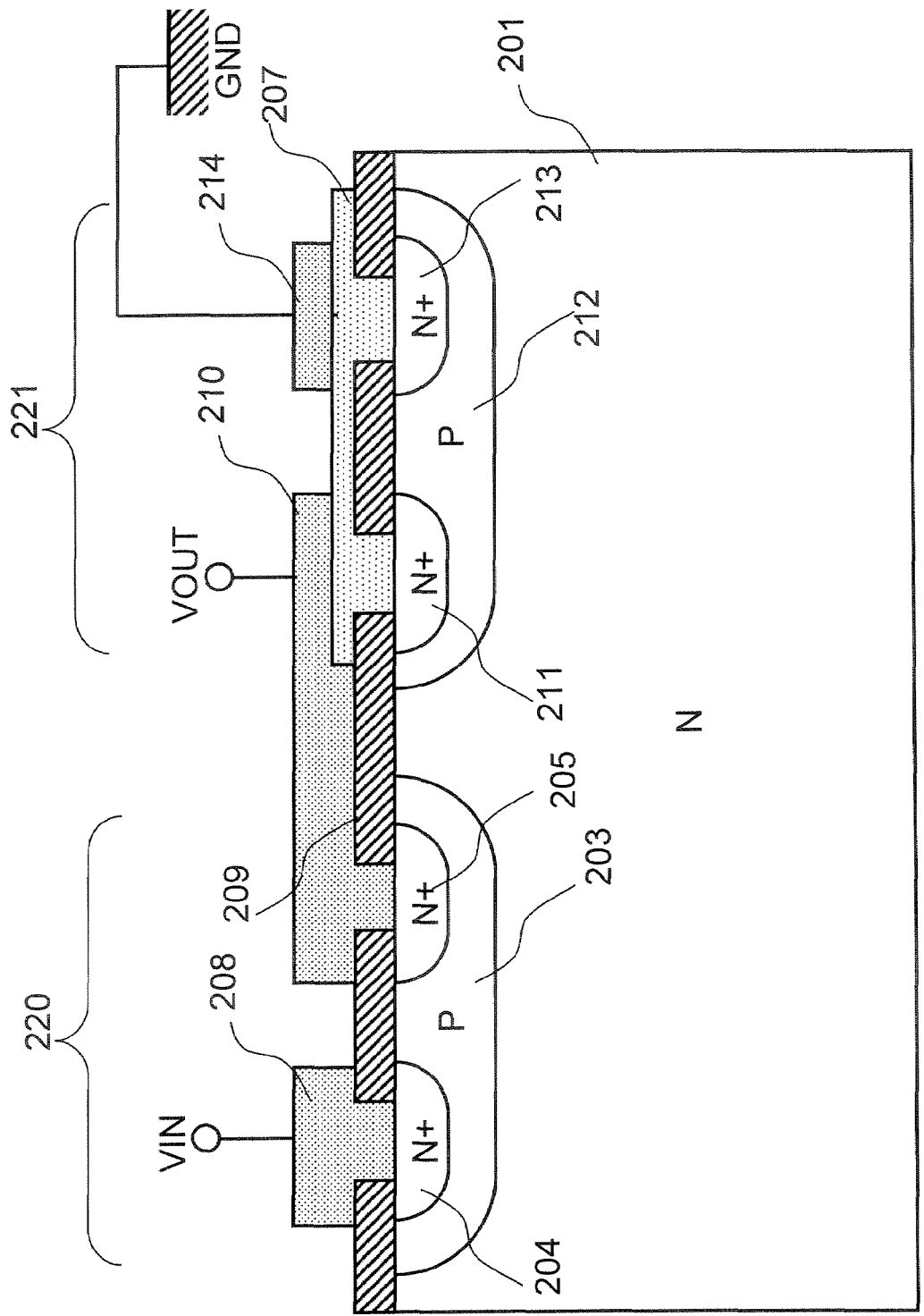
FIG. 7 is a cross section of the relevant part of the ESD protection device in FIG. 6.

FIG. 7 is a cross section of the relevant part of the ESD protection device in FIG. 6.

As shown in FIG. 7, a diode (bidirectional Zener diode) 220, which constitutes the first ESD protection diode is connected between a signal input (VIN) and a signal output (VOUT), and a resistor layer 207 and a diode (bidirectional Zener diode) 221, which constitutes the second ESD protection diode are connected in parallel between the signal output (VOUT) and the ground terminal (GND). On the major surface of an N-type semiconductor substrate 201, a signal input electrode 208, a signal output electrode 210 and a ground electrode 214 are formed. On the surface region of the major surface of the semiconductor substrate 201, P-type impurity diffusion layers 203 and 212 are formed separately each other. N+-high-concentration impurity diffusion regions 204, 205 are formed in the P-type impurity diffusion region 203 and exposed to the surface, and N+-high-concentration impurity diffusion regions 211, 213 are formed in the P-type impurity diffusion layer 212 and exposed to the surface.

The N+-high-concentration impurity diffusion regions 204, 205, 211, 213 have an impurity concentration of $1\times10^{19}$/cm$^3$ or more, and the N-type semiconductor substrate 201 has an impurity concentration of about $1\times10^{15}$/cm$^3$. The major surface of the semiconductor substrate 201 is covered with an interlayer insulating film 209 such as a silicon oxide film, except in the center portion of the N+-high-concentration impurity diffusion regions 204, 205, 211, 213. A resistor layer 207 is formed on the interlayer insulating film 209. One end of the resistor layer 207 is connected to the exposed surface of the N+-high-concentration impurity diffusion region 211, and the other end is connected to the exposed surface of the N+-high-concentration impurity diffusion region 213. The resistor layer 207 can be made of polysilicon and tungsten silicide or the like. A ground electrode 214 is formed on the other end of the resistor layer 207 being in contact with the N+-high-concentration impurity diffusion region 213 and is grounded. Furthermore, a signal output electrode 210 is formed on the interlayer insulting film 209 and connected to the signal output terminal (VOUT). One end of the signal output electrode 210 is connected to the exposed surface of the N+-high-concentration impurity diffusion region 205, and the other end is connected to one end of the resistor layer 207 being in contact with the N+-high-concentration impurity diffusion region 211. Moreover, a signal input electrode 208 is formed on the exposed surface of the N+-high-concentration impurity diffusion region 204, and connected to the signal input terminal (VIN).

Here, the ESD protection diode 220 is configured in the semiconductor substrate 201 so that the signal input electrode 208 serves as an anode electrode, the N+-high-concentration impurity diffusion region 204 as an anode region, the P-type impurity diffusion region 203 as a base region, the N+-high-concentration impurity diffusion region 205 as a cathode region, and the signal output electrode 210 as a cathode electrode. Furthermore, the ESD protection diode 221 is configured in the semiconductor substrate 201 so that the signal output electrode 210 serves as an anode electrode, the N+-high-concentration impurity diffusion region 211 as an anode region, the P-type impurity diffusion region 212 as a base region, the N+-high-concentration impurity diffusion region 213 as a cathode region, and the ground electrode 214 as a cathode electrode. The resistor layer (polysilicon film) 207 made of polysilicon or the like is grounded via the ground electrode 214. One end of the resistor layer 207 is connected to the output signal terminal (VOUT) and the anode region of the diode 221, and the other end is connected to the cathode region of the diode 221.

When an ESD pulse is applied to the VIN terminal (anode terminal of the diode 220), breakdown occurs in the PN junction of the ESD protection diode 220 and the ESD protection diode 221, which releases electric charge through the ESD protection diode 220, the signal output electrode 210, the ESD protection diode 221 and the ground electrode 214 to the ground. Furthermore, when a signal is inputted to the VIN terminal, a CR filter composed of the junction capacitance of the diode 220 and the resistor layer 207 operates to attenuate low-frequency signals, thereby acting as a high-pass filter. This configuration enables a high-pass filter to be formed on one chip. Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements. In addition, the junction capacitance of the diode 221 is preferably smaller than the junction capacitance of the diode 220 in order to improve filter characteristics. To this end, the diode 221 needs to be formed to have a smaller area than the diode 220.

In FIG. 7, while the diode 220 and the diode 221 are formed so as to have a common section, another variety of arrangements can be made without limitation to the configuration in FIG. 7.

Sixth Embodiment

The fourth embodiment 6 is described with reference to FIG. 8.

Figure 8:
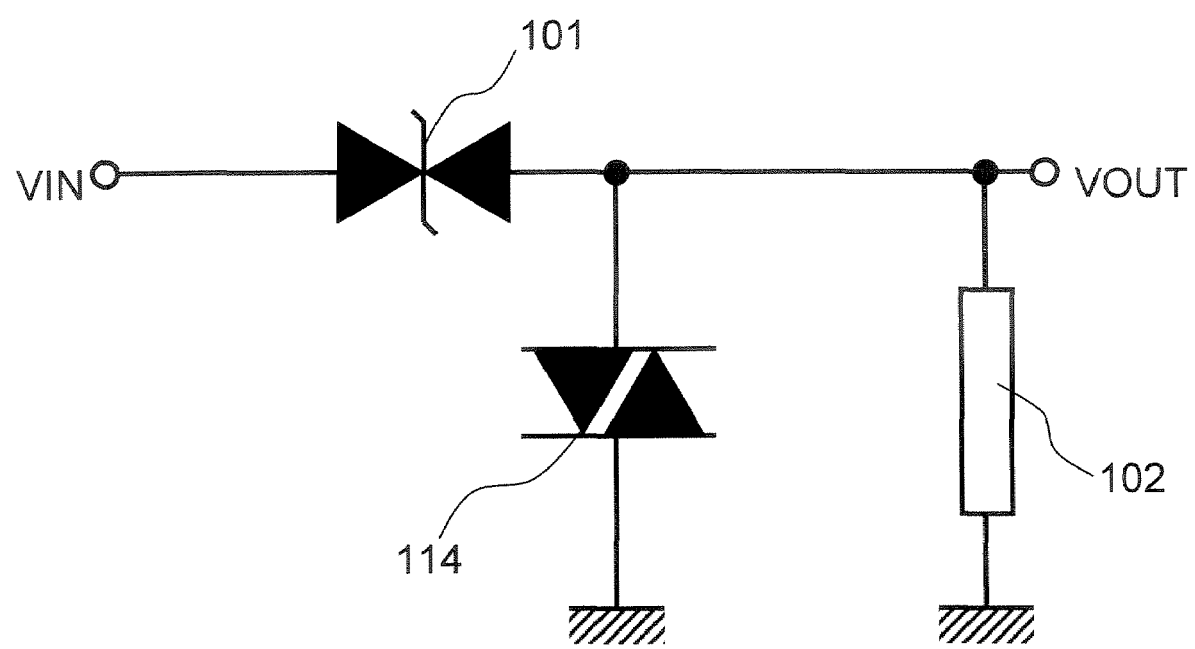
FIG. 8 is an equivalent circuit diagram of an ESD protection device according to a sixth embodiment.

FIG. 8 is an equivalent circuit diagram of an ESD protection device according to this embodiment. The ESD protection device in FIG. 8 differs from the ESD protection device in FIG. 6 in the point a bidirectional trigger diode 114 is used in stead of a bidirectional Zener diode as a rectifier element connected between the signal output terminal (VOUT) and the signal input terminal (VIN). This configuration can also demonstrate the same operation and effect as the ESD protection device shown in FIG. 6. Since the bidirectional trigger diode 114 has a higher ability to pass current per unit area than the bidirectional Zener diode and can reduce the capacitance per unit area, the filtering characteristics and the ESD tolerance can be more improved than the ESD protection device shown in FIG. 6.

Figure 9:
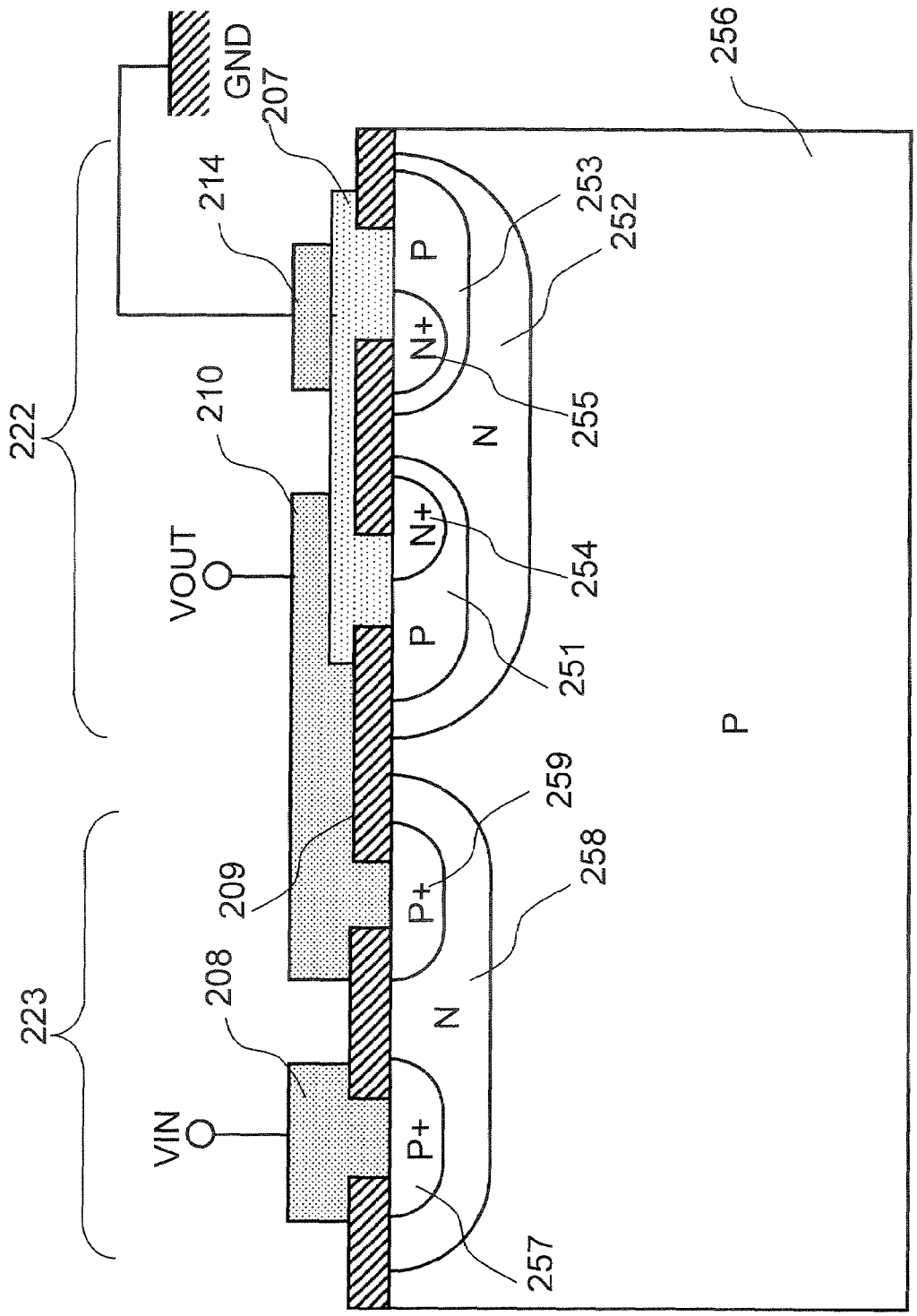
FIG. 9 is a cross section of the relevant part of the ESD protection device in FIG. 8.

FIG. 9 is a cross section of the relevant part of the ESD protection device in FIG. 8.

As shown in FIG. 9, a diode (bidirectional Zener diode) 223, which constitutes the first ESD protection diode is connected between a signal input (VIN) and a signal output (VOUT), and a resistor layer 207 and a diode (bidirectional Zener diode) 222, which constitutes the second ESD protection diode are connected between the signal output (VOUT) and the ground terminal (GND). On the major surface of a P-type semiconductor substrate 256, a signal input electrode 208, a signal output electrode 210 and a ground electrode 214 are formed. On the surface region of the major surface of the semiconductor substrate 256, N-type impurity diffusion layers 258 and 252 are formed separately each other. $P^+$-high-concentration impurity diffusion regions 257, 259 are formed in the N-type impurity diffusion layer 258 and exposed to the surface, and P-type impurity diffusion layers 251, 253 are formed in the N-type impurity diffusion layer 252 and exposed to the surface, furthermore an $N^+$-high-concentration impurity diffusion region 254 is formed in the P-type impurity diffusion layer 251 and exposed to the surface, and an $N^+$-high-concentration impurity diffusion region 255 is formed in the P-type impurity diffusion layer 253 and exposed to the surface.

The $P^+$-high-concentration impurity diffusion regions 257, 259 have an impurity concentration of $1\times10^{18}/cm^3$ or more, and the $N^+$-high-concentration impurity diffusion regions 254, 255 have an impurity concentration of $1\times10^{19}/cm^3$ or more. The P-type semiconductor substrate 256 has an impurity concentration of about $1\times10^{15}/cm^3$. The major surface of the semiconductor substrate 256 is covered with an interlayer insulating film 209 such as a silicon oxide film, except in the center portion of the $P^+$-high-concentration impurity diffusion regions 257, 259 and except in the center portion of the P-type impurity diffusion layers 251, 253. In addition, the part or the whole of the $N^+$-high-concentration impurity diffusion region 254 formed in the P-type impurity diffusion layer 251 and the $N^+$-high-concentration impurity diffusion region 255 formed in the P-type impurity diffusion layer 253 are exposed to the interlayer insulating film 209. A resistor layer 207 is formed on the interlayer insulating film 209. One end of the resistor layer 207 is connected to the exposed surface of the P-type impurity diffusion layer 251 and the $N^+$-high-concentration impurity diffusion region 254, and the other end is connected to the exposed surface of the P-type impurity diffusion layer 253 and the $N^+$-high-concentration impurity diffusion region 255. The resistor layer 207 can be a metal silicide film made of tungsten silicide or the like. A ground electrode 214 is formed on the other end of the resistor layer 207 being in contact with the P-type impurity diffusion layer 253 and the $N^+$-high-concentration impurity diffusion region 255, and is grounded. Furthermore, a signal output electrode 210 made of a metal film is formed on the interlayer insulting film 209 and connected to the signal output terminal (VOUT). One end of the signal output electrode 210 is connected to the exposed surface of the $P^+$-high-concentration impurity diffusion region 259, and the other end is connected to the one end of the resistor layer 207 being in contact with the P-type impurity diffusion layer 251 and the $N^+$-high-concentration impurity diffusion region 254. Moreover, a signal input electrode 208 is formed on the exposed surface of the $P^+$-high-concentration impurity diffusion region 257, and connected to the signal input terminal (VIN).

Here, the ESD protection diode 223 is configured in the semiconductor substrate 256 so that the signal input electrode 208 serves as an anode electrode, the $P^+$-high-concentration impurity diffusion region 257 as an anode region, the P-type impurity diffusion region 203 as a base region, the $P^+$-high-concentration impurity diffusion region 259 as a cathode region, and the signal output electrode 210 as a cathode electrode Furthermore, the ESD protection diode 222 is configured in the semiconductor substrate 256 so that the signal output electrode 210 serves as an anode electrode, the P-type impurity diffusion layer 251 and the $N^+$-high-concentration impurity region 254 as an anode region, the N-type impurity diffusion layer 252 as a base region, the P-type impurity diffusion layer 253 and $N^+$-high-concentration impurity diffusion region 255 as a cathode region, and the ground electrode 214 as a cathode electrode.

When an ESD pulse is applied to the VIN terminal (anode terminal of the diode 223), breakdown occurs in the PN junction of the ESD protection diode 223, moreover, breakover occurs in the diode 222, which release electric charge through the ESD protection diode 223, signal output electrode 210, the ESD protection diode 222 and the ground electrode 214 to the ground. Furthermore, when a signal is inputted to the VIN terminal, a CR filter composed of the junction capacitance of the diode 223 and the resistor layer 207 operates to attenuate low-frequency signals, thereby acting as a high-pass filter. This configuration enables a high-pass filter to be formed on one chip. Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements In addition, the junction capacitance of the diode 222 is preferably smaller than the junction capacitance of the diode 223 in order to improve filter characteristics. In general, since a trigger diode has a smaller junction capacitance per unit area than a bidirectional Zener diode, a magnitude relation of the junction capacitance is more easily realized than the case of the fourth embodiment.

In FIG. 9, while the diode 223 and the diode 222 are formed so as to have a common section, another variety of arrangements can be made without limitation to the configuration in FIG. 9.

Seventh Embodiment

The fourth embodiment 7 is described with reference to FIG. 10.

Figure 10:
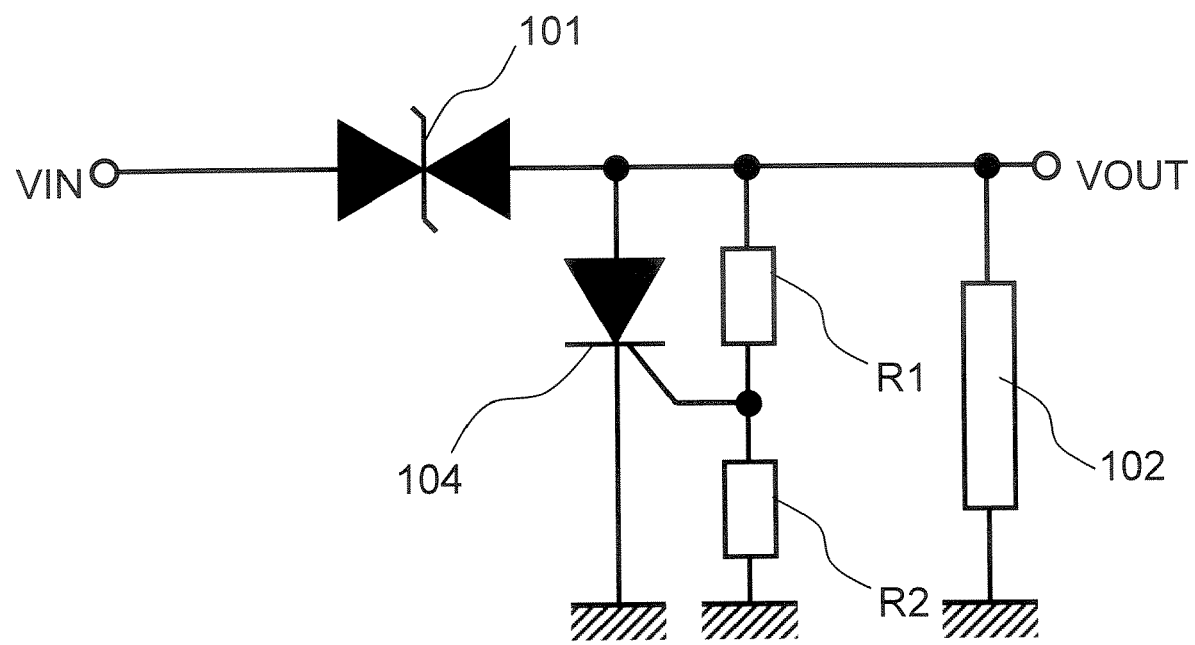
FIG. 10 is an equivalent circuit diagram of an ESD protection device according to a seventh embodiment.

FIG. 10 is an equivalent circuit diagram of an ESD protection device according to this embodiment. The ESD protection device in FIG. 10 differs from the ESD protection device in FIG. 8 in the point that a switch composed of a thyristor 104 and divide resistors R1, R2 are used in stead of a bidirectional Zener diode as a rectifier element connected between the signal output terminal (VOUT) and the signal input terminal (VIN). This configuration can also demonstrate the same operation and effect as the ESD protection device shown in FIG. 8. Since the switch composed of the thyristor and divide resistors can be reliably on by a lower voltage applied to VOUT than the bidirectional trigger diode, protection performance of the protected device connected to VOUT can be improved.

In addition, diodes can be connected in series in stead of resistors R1, R2. The thyristor can also be turned on in this case, therefore the same performance and effects can be expected. Moreover, since the ESD tolerance of the diode is higher than that of the resistor, the ESD tolerance of the ESD protection device increases.

Figure 11:
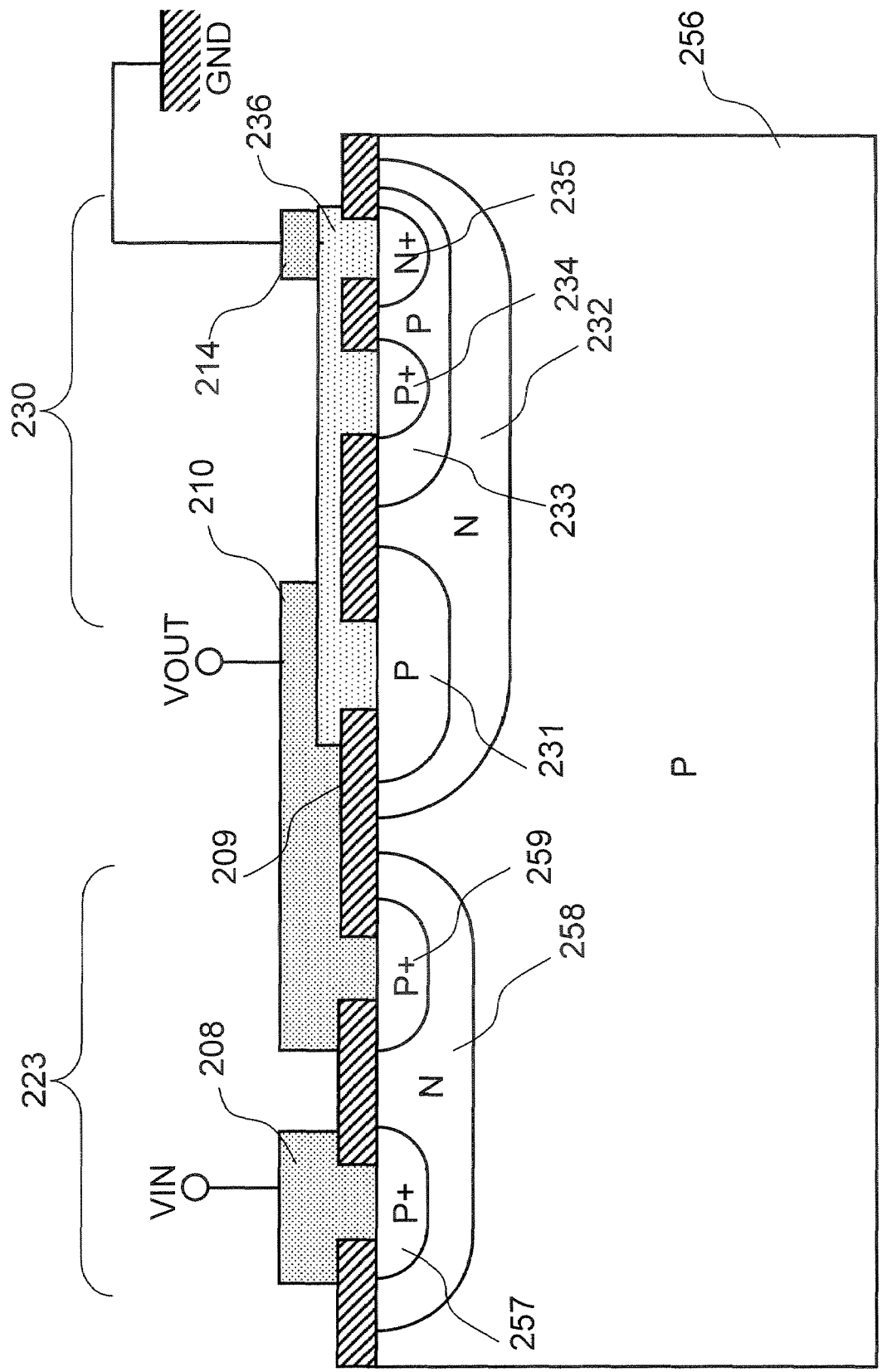
FIG. 11 is a cross section of the relevant part of the ESD protection device in FIG. 10.

FIG. 11 is a cross section of the relevant part of the ESD protection device in FIG. 10. As shown in FIG. 11, a diode (bidirectional Zener diode) 223 as a bidirectional rectifier portion is connected between a signal input (VIN) and a signal output (VOUT), and a resistor layer 236 and a thyristor 230, which constitutes the ESD protection diode are connected between the signal output (VOUT) and the ground terminal (GND). In addition, a resistor 102 shown in FIG. 10 is not shown. On the major surface of a P-type semiconductor substrate 256, a signal input electrode 208, a signal output electrode 210 and a ground electrode 214 are formed. On the surface region of the major surface of the semiconductor substrate 256, N-type impurity diffusion layers 258 and 232 are formed separately each other. P$^+$-high-concentration impurity diffusion regions 257, 259 are formed in the N-type impurity diffusion layer 258 and exposed to the surface. P-type impurity diffusion layers 231, 233 are formed in the N-type impurity diffusion layer 232 and exposed to the surface. Furthermore, a P$^+$-high-concentration impurity diffusion region 234 and an N$^+$-high-concentration impurity diffusion region 235 are formed in the P-type impurity diffusion layer 233 and exposed to the surface.

The P$^+$-high-concentration impurity diffusion regions 257, 259, 234 have an impurity concentration of $1 \times 10^{18}$/cm$^3$ or more, and the N$^+$-high-concentration impurity diffusion region 235 has an impurity concentration of $1 \times 10^{19}$/cm$^3$ or more. The P-type semiconductor substrate 256 has an impurity concentration of about $1 \times 10^{15}$/cm$^3$. The major surface of the semiconductor substrate 256 is covered with an interlayer insulating film 209 such as a silicon oxide film, except in the center portion of the P$^+$-high-concentration impurity diffusion regions 257, 259, 234, the P-type impurity diffusion layer 231, and the N$^+$-high-concentration impurity diffusion region 235. A resistor layer 236 is formed on the interlayer insulating film 209. One end of the resistor layer 236 is connected to the exposed surface of the P-type impurity diffusion layer 231 and connected to the exposed surface of the P$^+$-high-concentration impurity diffusion region 234 at the center portion, and the other end is connected to the exposed surface of the N$^+$-high-concentration impurity diffusion region 235. The resistor layer 236 can be a polysilicon film and a metal silicide film made of tungsten silicide or the like.

A ground electrode 214 is formed on the other end of the resistor layer 236 being in contact with the N$^+$-high-concentration impurity diffusion region 235, and is grounded. Furthermore, a signal output electrode 210 made of a metal film is formed on the interlayer insulting film 209 and connected to the signal output terminal (VOUT). One end of the signal output electrode 210 is connected to the exposed surface of the P$^+$-high-concentration impurity diffusion region 259, and the other end is connected to one end of the resistor layer 236 being in contact with the P-type impurity diffusion layer 231. Moreover, a signal input electrode 208 is formed on the exposed surface of the P$^+$-high-concentration impurity diffusion region 257, and connected to the signal input terminal (VIN).

Here, the ESD protection diode 223 is configured in the semiconductor substrate 256 so that the signal input electrode 208 serves as an anode electrode, the P$^+$-high-concentration impurity diffusion region 257 as an anode region, the P-type impurity diffusion region 203 as a base region, the P$^+$-high-concentration impurity diffusion region 259 as a cathode region, and the signal output electrode 210 as a cathode electrode. Furthermore, the thyristor 230 is configured in the semiconductor substrate 256 so that the signal output electrode 210 serves as an anode electrode, the P-type impurity diffusion layer 231 as an anode region, the N-type impurity diffusion layer 232 as a N-base region, the P-type impurity diffusion layer 233 as a P-base region, the P$^+$-high-concentration impurity diffusion region 234 as a gate region, the N$^+$-high-concentration impurity diffusion region 235 as a cathode region, and the ground electrode 214 as a cathode electrode. The resistor layer 236 is connected to the signal output terminal (VOUT) and the anode region of the thyristor 230 at one end, connected to the gate region of the thyristor 230 at the center portion, connected to the cathode region of the thyristor at the other end, and grounded via the ground electrode 214. That is, the resistor layer 236 corresponds to resistors R1 and R2 shown in FIG. 10.

When an ESD pulse is applied to the VIN terminal (anode terminal of the diode 223), breakdown occurs in the PN junction of the ESD protection diode 223, moreover, the voltage applied to VOUT is divided by the resistor layer 236, then the electric potential at the gate region 234 of the thyristor 230 increases higher than the electric potential at the cathode region 235 of the thyristor 230 and the switch is on. In the state of the switch being on, electric charge is released through the ESD protection diode 223, the signal output electrode 210, the thyristor 230 and the ground electrode 214 to the ground Furthermore, when a signal is inputted to the VIN terminal, a CR filter composed of the junction capacitance of the diode 223, the resistor layer 236 and the resistor 102 not shown (refer to FIG. 10) operates to attenuate low-frequency signals, thereby acting as a high-pass filter. This configuration enables a high-pass filter to be formed on one chip. Because a high-pass filter is formed on one chip, the degradation of filter characteristics due to the influence of parasitic inductance can be prevented. One-chip configuration can reduce the footprint, and can improve filter characteristics because there is no parasitic inductance associated with wires for connection between elements. In addition, the junction capacitance of the thyristor 230 is preferably smaller than the junction capacitance of the diode 223 in order to improve filter characteristics. In general, since a trigger diode has a smaller junction capacitance per unit area than a bidirectional Zener diode, a magnitude relation of the junction capacitance is more easily realized than the case of the fourth embodiment In FIG. 11, while the diode 223 and the thyristor 230 are formed so as to have a common section, another variety of arrangements can be made without limitation to the configuration in FIG. 11.

Figure 12:
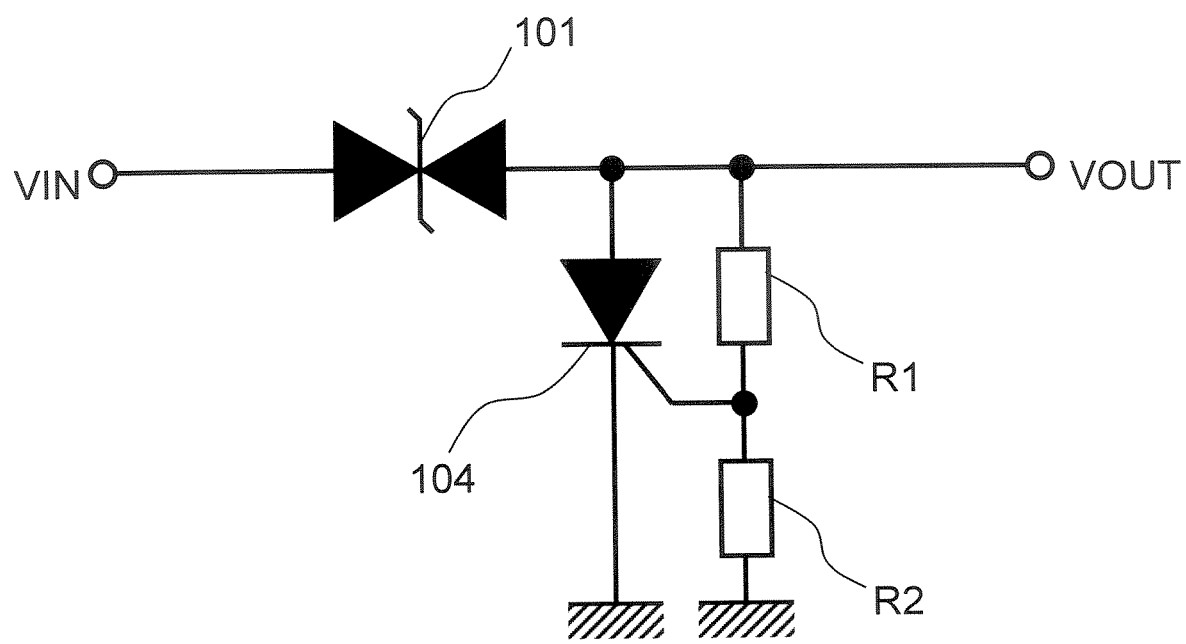
FIG. 12 shows the modification example of the seventh embodiment.

FIG. 12 shows the modification example of the seventh embodiment.

The ESD protection device shown in FIG. 12, in contrast to the ESD protection device shown in FIG. 10, has the configuration which the resistor 102 is deleted. Since the divide resistors R1 and R2 for the thyristor being on play a part of the resistor of the CR filter as a high-pass filter, the same performance and effects as those of the ESD protection device shown in FIG. 10 can be expected in this configuration. The deletion of the resistor 102 can reduce the device area, and the degradation of filter characteristics due to the influence of parasitic inductance can be prevented, then the contribution to the cost reduction can be made.

Eighth Embodiment

The fourth embodiment 8 is described with reference to FIG. 13.

Figure 13:
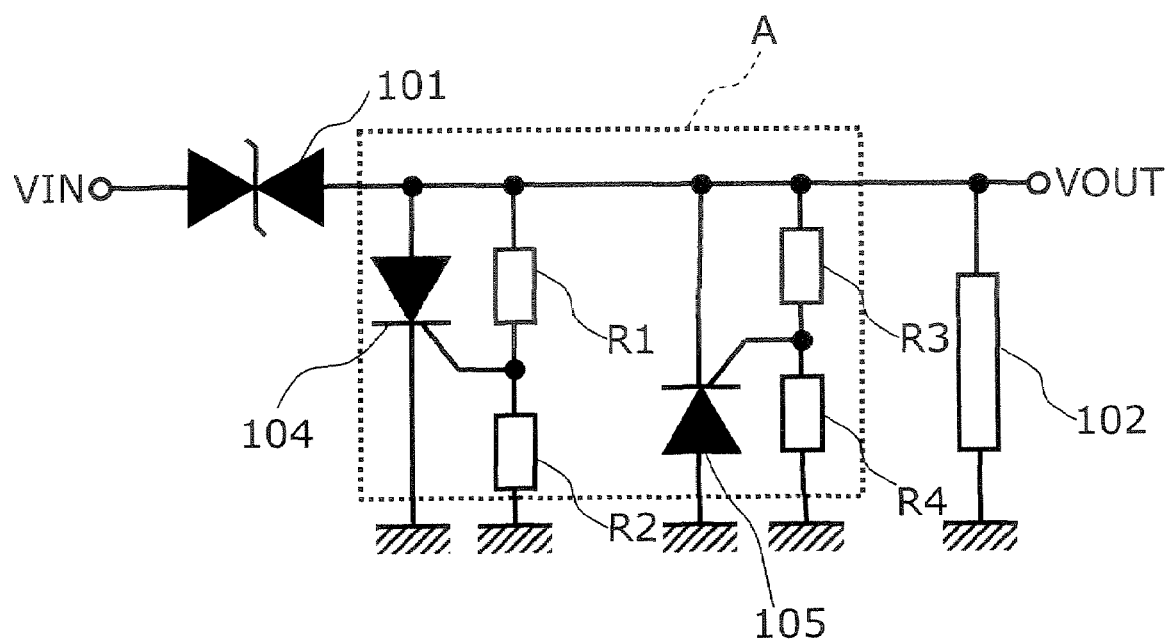
FIG. 13 is an equivalent circuit diagram of an ESD protection device according to eighth embodiment.

FIG. 13 is an equivalent circuit diagram of an ESD protection device according to this embodiment. The ESD protection device in FIG. 13 differs from the ESD protection device in FIG. 10 in the point that a rectifier element connected between the signal output terminal (VOUT) and the signal input terminal (VIN) is configured by a switch composed of a thyristor and divide resistors and a switch having a reverse direction thyristor. This configuration can also demonstrate the same operation and effect as the ESD protection device shown in FIG. 10. In addition, in the configuration shown in FIG. 13, even if a reversely polarized ESD pulse is applied to VIN or VOUT, the protected device connected to VOUT can be protected. Additionally, as well the configuration described concerning about the seventh embodiment, the resistor 102 can be abbreviated.

Figure 14:
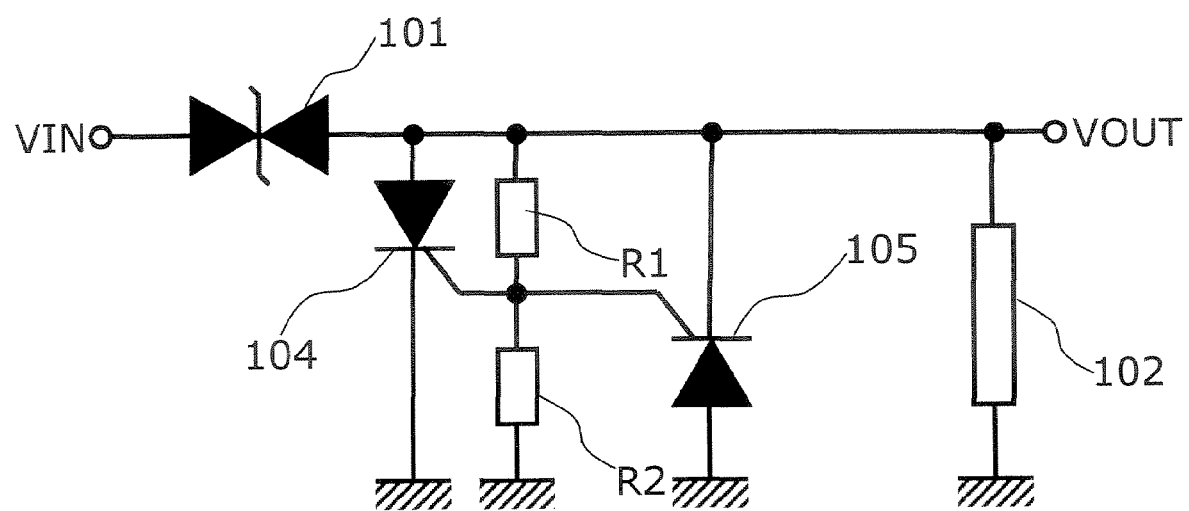
FIG. 14 is an equivalent circuit diagram of the modification example of the eighth embodiment.

FIG. 14 is an equivalent circuit diagram of the modification example of the eighth embodiment.

The ESD protection device shown in FIG. 14, in contrast to the ESD protection device shown in FIG. 13, R1, R2 are used as divide resistors for the bipolar thyristor 104, 105 being on. This configuration can also demonstrate the same operation and effects as the ESD protection device shown in FIG. 10.

Ninth Embodiment

The fourth embodiment 9 is described with reference to FIG. 15.

Figure 15:
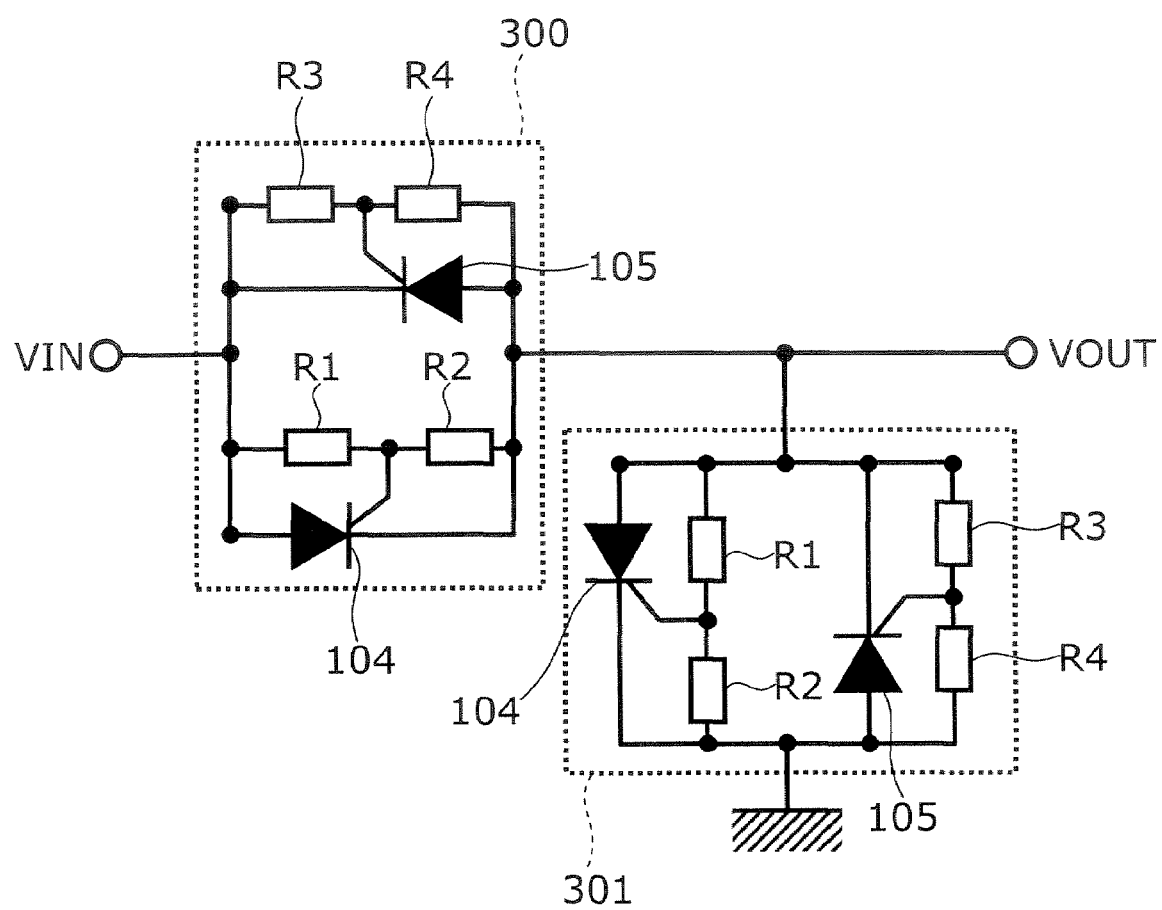
FIG. 15 is an equivalent circuit diagram of an ESD protection device according to ninth embodiment.

FIG. 15 is an equivalent circuit diagram of an ESD protection device according to this embodiment. A bidirectional rectifier portion 300 in this embodiment is equivalent to the circuit A surrounded by dotted line in FIG. 13. Furthermore, that is, the ESD protection device in FIG. 15 differs from the ESD protection device in FIG. 13 in the point that a switch composed of a thyristor and divide resistors are used in stead of a bidirectional Zener diode as the bidirectional rectifier portion 300 connected between the signal output terminal (VOUT) and the signal input terminal (VIN). This configuration can also demonstrate the same operation and effects as the ESD protection device shown in FIG. 13. Since the thyristor is used instead of the bidirectional Zener diode, performance to pass current increases, therefore the ESD tolerance of the ESD protection device is improved.

Figure 16:
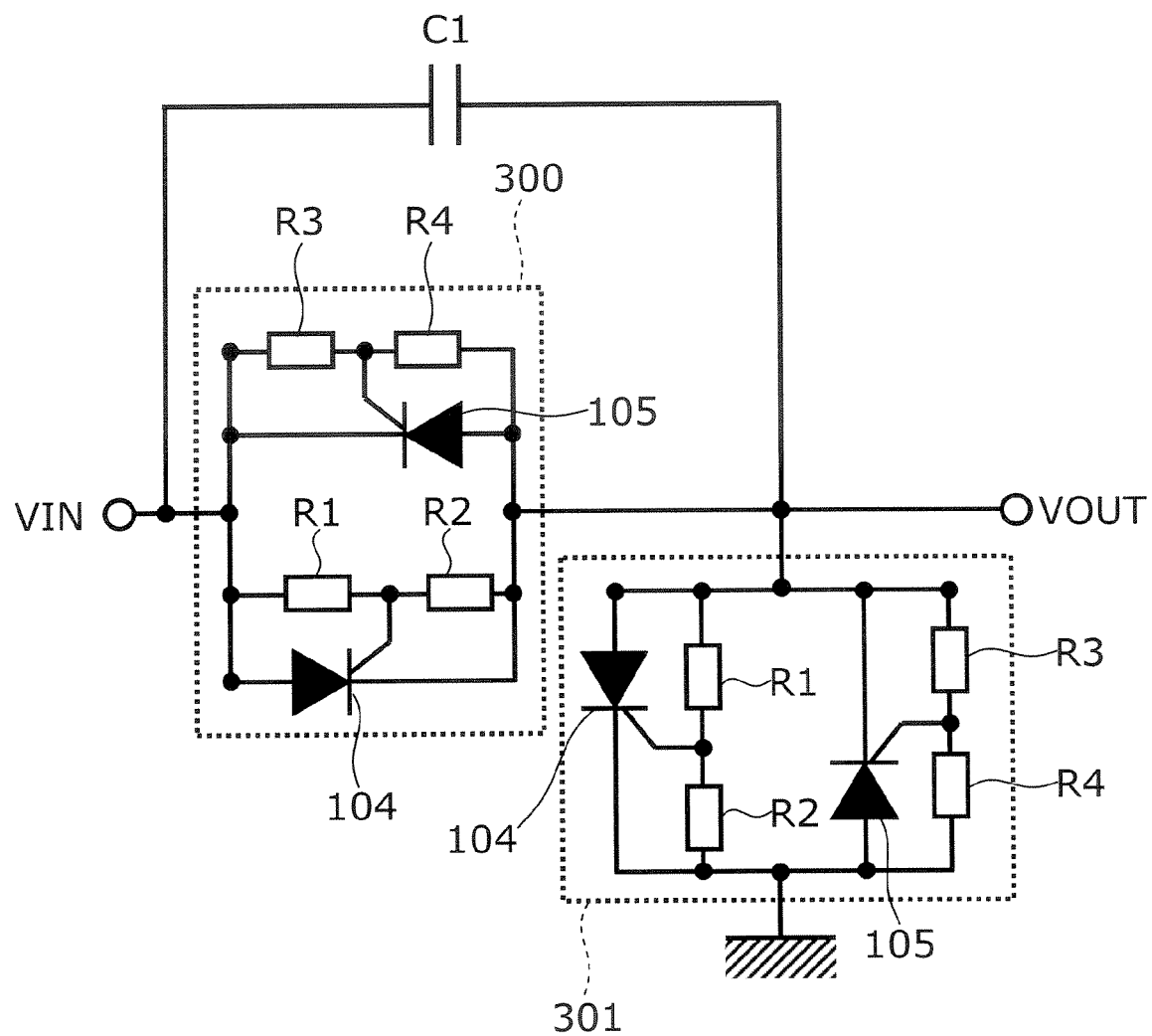
FIG. 16 is an equivalent circuit diagram showing the modification example of the ninth embodiment.

FIG. 16 is an equivalent circuit diagram showing the modification example of the ninth embodiment.

In the ESD protection device shown in FIG. 16, a capacitance C1 is inserted in parallel between the signal input terminal (VIN) and the signal output terminal (VOUT). This configuration can improve the filter characteristics, because the capacitance between the signal input terminal (VIN) and the signal output terminal (VOUT) becomes large, even if the bidirectional rectifier portion 300 and a circuit 301 has the common configuration. Moreover, the increase of the freedom of the circuit can change the filter characteristics into a desirable one.

Additionally, in the ESD protection device shown in FIG. 15 and FIG. 16, the thyristor 104 and 105 in the bidirectional rectifier portion 300 and the circuit 301 can be on by common divide resistors R1 and R2 as well as the ESD protection device shown in FIG. 14.

The embodiments of the invention have been described with reference to the examples However, the invention is not limited to these examples, and may be embodied in other specific forms at time of working without departing from the essential gist. Furthermore, the embodiments include inventions at different phase, and various inventions can be extracted on appropriate combination of a plurality of constituted features disclosed.

The invention claimed is:
1. An ESD protection device comprising:
    a signal input electrode;
    a signal output electrode;
    a ground electrode;
    a bidirectional rectifier connected between the signal input electrode and the signal output electrode;
    a first resistor connected between the signal output electrode and the ground electrode; and
    a first rectifying element electrically connected in parallel with the first resistor between the signal output electrode and the ground electrode;
    wherein the bidirectional rectifier is a first bidirectional Zener diode, and
    the first rectifying element is a second bidirectional Zener diode whose junction capacitance is smaller than that of the first bidirectional Zener diode.
2. The ESD protection device according to claim 1, wherein the bidirectional rectifier includes:
    a first diffusion region of a second conductivity type selectively formed on a surface region of a major surface of a semiconductor substrate of a first conductivity type;
    a second diffusion region of the first conductivity type selectively formed on a surface region of the first diffusion region of the second conductivity type; and
    a third diffusion region of the first conductivity type selectively formed on a surface region of the first diffusion region of the second conductivity type, the first rectifying element includes:
    a fourth diffusion region of the second conductivity type selectively formed on a surface region of the major surface of the semiconductor substrate of the first conductivity type;
    a fifth diffusion region of the first conductivity type selectively formed on a surface region of the fourth diffusion region of the second conductivity type; and
    a sixth diffusion region of the first conductivity type selectively formed on a surface region of the fourth diffusion region of the second conductivity type,
    the first resistor is a resistor layer formed on the major surface of the semiconductor substrate of the first conductivity type, the resistor layer being connected to the fifth diffusion region of the first conductivity type and to the sixth diffusion region of the first conductivity type,
    the signal input electrode is connected to the second diffusion region of the first conductivity type, and
    the signal output electrode is connected to the third diffusion region of the first conductivity type and to the first resistor.

* * * * *